US008866662B1

(12) United States Patent
Naumov

(10) Patent No.: US 8,866,662 B1
(45) Date of Patent: Oct. 21, 2014

(54) SEQUENTIAL ANALOG/DIGITAL CONVERSION AND MULTIPLICATION

(71) Applicant: Steve Naumov, Chicago, IL (US)

(72) Inventor: Steve Naumov, Chicago, IL (US)

(*) Notice: Subject to any disclaimer, the term of this patent is extended or adjusted under 35 U.S.C. 154(b) by 0 days.

(21) Appl. No.: 13/656,735

(22) Filed: Oct. 21, 2012

(51) Int. Cl.
*H03M 1/38* (2006.01)
*H03M 1/62* (2006.01)
*H03M 1/16* (2006.01)

(52) U.S. Cl.
CPC ............... *H03M 1/62* (2013.01); *H03M 1/164* (2013.01)
USPC .......................................... 341/161; 341/155

(58) Field of Classification Search
CPC ....... H03M 1/144; H03M 1/145; H03M 1/12; H03M 1/62; H03M 1/164
USPC .................. 341/155, 144, 163, 120, 118, 161
See application file for complete search history.

(56) References Cited

U.S. PATENT DOCUMENTS

| 3,470,363 | A | 9/1969 | Aitchison |
| 4,291,387 | A | 9/1981 | Buchanan et al. |
| 4,866,443 | A | 9/1989 | Okada et al. |
| 4,896,284 | A | 1/1990 | Takeuchi et al. |
| 4,903,027 | A | 2/1990 | Takeuchi et al. |
| 4,918,453 | A | 4/1990 | Kimura et al. |
| 4,947,173 | A | 8/1990 | Okada et al. |
| 4,978,956 | A * | 12/1990 | Berresheim .................... 341/155 |
| 5,274,386 | A * | 12/1993 | Pellon ........................... 342/380 |
| 5,539,685 | A | 7/1996 | Otaguro |
| 6,169,771 | B1 * | 1/2001 | Shou et al. .................... 375/343 |
| 6,362,767 | B1 | 3/2002 | Yang et al. |
| 6,970,125 | B2 * | 11/2005 | Cesura et al. ................. 341/161 |
| 7,283,074 | B2 * | 10/2007 | Sheng et al. .................. 341/120 |
| 7,643,956 | B2 * | 1/2010 | Ma ................................ 702/107 |
| 8,120,520 | B2 | 2/2012 | Jeong et al. |
| 2012/0030267 | A1 | 2/2012 | Rubio et al. |

FOREIGN PATENT DOCUMENTS

WO 00/34853 A1 6/2000

* cited by examiner

*Primary Examiner* — Peguy Jean Pierre

(57) ABSTRACT

An embodiment of an apparatus for performing sequential analog/digital conversion and multiplication generates upon completing the conversion a digital output indicative of an analog input and a digital product equivalent to the product formed by multiplying a digital operand with the digital output indicative of the input. The apparatus is configured to exploit parallelism per conversion iteration such that the time per iteration can be substantially determined by the conversion processing. During each iteration, a converter processes the analog input to determine the manner in which to refine the digital output while a multiplier combines the operand with a previous partial result to generate a speculative partial result and a weighted previous partial result. According to the determination, the converter refines the digital output while the multiplier selects as a partial result output the speculative partial result or the weighted previous partial result. Additional embodiments are shown and described.

19 Claims, 6 Drawing Sheets

SEQUENTIAL ANALOG/DIGITAL CONVERSION AND MULTIPLICATION

CROSS-REFERENCE TO RELATED APPLICATION

Not Applicable

STATEMENT REGARDING FEDERALLY SPONSORED RESEARCH OR DEVELOPMENT

Not Applicable

BACKGROUND

It may be necessary in several signal processing applications to generate a digital product formed by multiplying a digital operand with a digital word, wherein the digital word is indicative of an analog input. It may also be necessary to manipulate the digital word together with the digital product in subsequent processing steps, which may include a frequency domain transformation. A conventional approach for generating both the digital word and the digital product is to first convert the analog input to the digital word representative thereof by employing a conventional analog/digital converter (ADC). A conventional digital multiplier may subsequently generate the digital product by multiplying the digital operand and the digital word. As a consequence of performing the multiplication subsequent to the completion of the conversion, this conventional approach is inherently slow and therefore may be undesirable.

In U.S. Pat. No. 3,470,363 issued Sep. 30, 1969 titled "Hybrid Multiplier Apparatus", Aitchison discloses a circuit arrangement for generating the digital product by multiplying the digital operand directly with the analog input. Particularly, the hybrid multiplier generates the digital product of a desired precision by successively generating trial digital products, dividing each trial digital product by the analog input to form a quotient, and comparing each quotient to the digital word. Since the precision for the digital product is commonly determined by combining the word lengths of the two operands as per conventional multipliers, the number of trial products, and accordingly, the number of clock cycles associated with making available the digital product may become unnecessarily excessive.

In U.S. Pat. No. 4,291,387 issued Sep. 22, 1981 titled "Analog to Digital Conversion Weighting Apparatus", Buchanan et al. disclose a circuit arrangement for generating the digital product formed by multiplying the digital operand with the digital word. The apparatus includes control means configured to transfer, from a bucket-brigade sequential ADC to a traditional sequential multiplier, each resolved bit of the digital word in succession from the most significant bit to the least significant bit. During a given conversion cycle, the sequential ADC outputs a resolved bit of the digital word and the control means transfers the resolved bit to the sequential multiplier where a partial product is generated in response to the resolved bit and the digital operand prior to the end of the conversion cycle, wherein a substantial portion of the conversion cycle is dedicated to generating the resolved bit. The partial product is then temporarily latched or stored for use in the following conversion cycle. During the next conversion cycle, as the sequential ADC outputs the next resolved bit of the digital word and the control means transfers the next resolved bit to the sequential multiplier for partial product generation, the sequential multiplier adds to a weighted summation of partial products the partial product generated in the previous conversion cycle.

Although the apparatus of Buchanan et al. sequentially processes the digital product and the digital word concurrently, according to Buchanan et al., the sequential multiplier makes available the digital product "substantially adjacent to the time of conversion of the least significant bit" of the digital word since the sequential multiplier temporarily latches or stores partial products. Particularly, the availability of the digital product lags the availability of the digital word by one conversion cycle such that the overall cycle latency of the apparatus for making available both the digital word and the digital product is one more than the number of cycles consumed by the sequential converter for converting the analog input.

In light of the aforementioned limitations and noting that it may be necessary to manipulate the digital word together with the digital product in subsequent processing steps, it is believed that a need remains for providing an apparatus which can substantially maintain the operative frequency at which the digital word is sequentially processed yet reduce the cycle latency associated with making available the digital product relative to the digital word.

SUMMARY

An apparatus for performing sequential analog/digital conversion and multiplication generates upon completing the conversion a digital output indicative of an analog input and a digital product equivalent to the product formed by multiplying a digital operand with the digital output indicative of the analog input. The apparatus is configured to perform a substantial portion of the per-iteration conversion processing in parallel with a substantial portion of the per-iteration multiplication processing. The per-iteration parallelism exploited by the apparatus can allow the time per iteration to be substantially determined by the conversion processing rather than the multiplication processing. In accordance with an embodiment, for each iteration, a converter processes the analog input to determine the manner in which to refine the digital output while a multiplier combines the digital operand with a previous partial result to generate a speculative partial result and a weighted previous partial result. In response to the determination, the converter refines the digital output while the multiplier selects as a partial result output the speculative partial result or the weighted previous partial result. Additional embodiments are shown and described.

DRAWINGS

The purpose and advantages of embodiments set forth herein will become apparent upon inspection of the drawings contained in the accompanying figures. In certain instances, well-known circuit elements and/or modules are shown in block diagram form to avoid obscuring the concepts conveyed by the embodiments. The shapes and/or dimensions shown in the drawings may be exaggerated for clarity. Like reference numerals identify similar, but not necessarily equivalent elements across multiple drawings included in the accompanying figures, in which.

DETAILED DESCRIPTION

Figure 1:
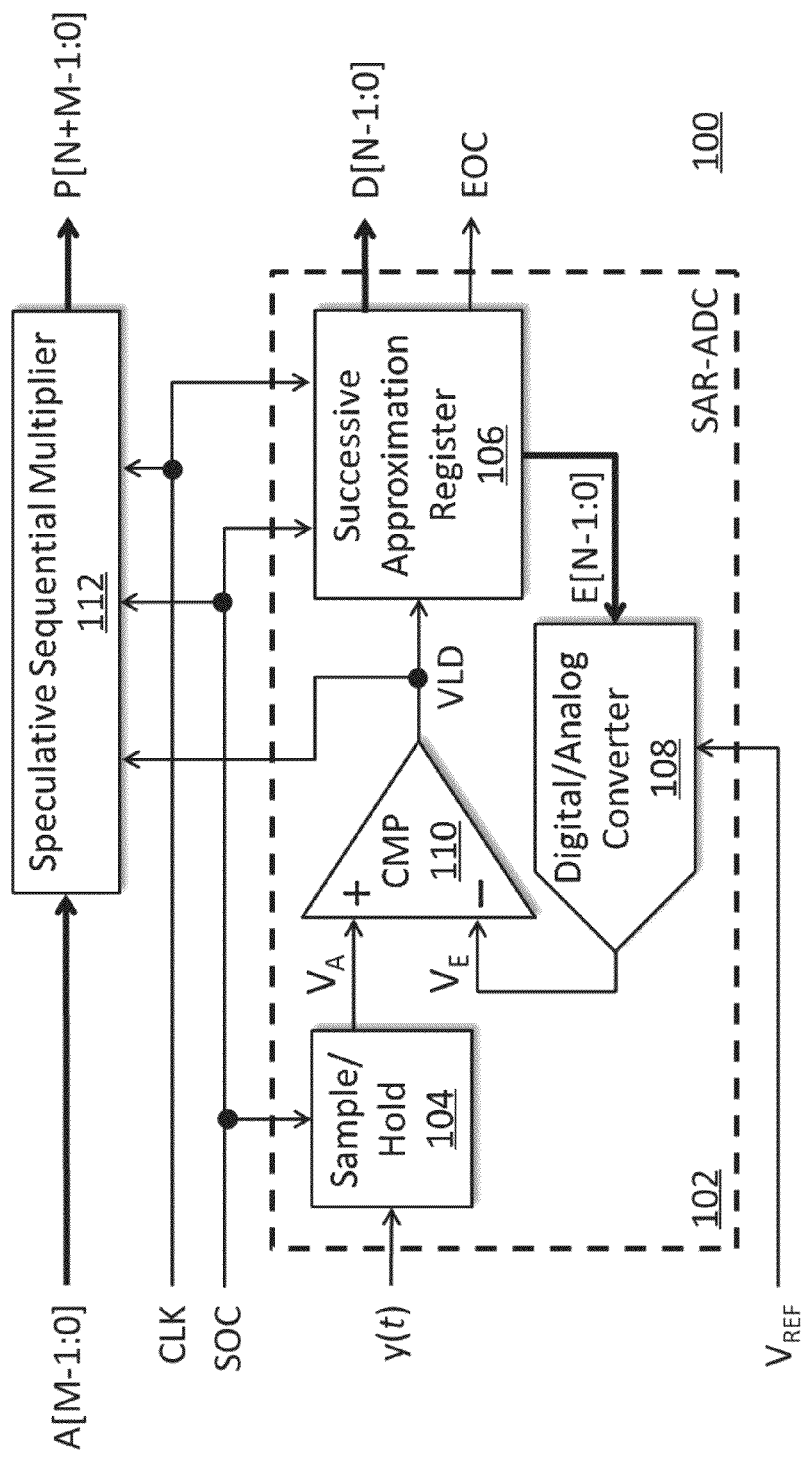
FIG. 1 shows a block diagram of an apparatus for performing sequential analog/digital conversion and multiplication in accordance with an embodiment.

FIG. 1: An Apparatus for Performing Sequential Analog/Digital Conversion and Multiplication FIG. 1 shows an apparatus 100 for performing sequential analog/digital conversion and multiplication in accordance with an embodiment. Generally, the apparatus 100 comprises a speculative sequential multiplier (SSM) module 112 and a sequential analog/digital converter. A sequential analog/digital converter is broadly defined herein to be one which is configured to convert an analog input to a digital output by refining in succession the digital output in response to processing the analog input, wherein the converter completes the conversion upon the digital output becoming indicative of the analog input. The digital output may be considered indicative of the analog input when the value of the digital output is representative of a particular interval of analog quantities which includes the value of the analog input, wherein the number of intervals is generally determined by the resolution of the converter. When refining the digital output in succession by processing the analog input, the sequential converter searches using a particular strategy through the number of intervals pending every interval is either explicitly or implicitly evaluated and/or the particular interval which includes the value of the analog input is encountered, thus indicating the end of conversion. One such sequential analog/digital converter is of the successive approximation register type. Accordingly, the apparatus 100 may comprise a successive approximation register analog/digital conversion (SAR-ADC) module 102 as shown in FIG. 1. The SAR-ADC module 102 may further comprise a sample/hold module 104, a successive approximation register (SAR) module 106, a digital/analog conversion (DAC) module 108, and a comparison (CMP) module 110.

The sample/hold module 104 receives an analog signal y(t) and a start-of-conversion command signal SOC. During a first cycle of an oscillating signal CLK, hereinafter referred to as a sample-hold cycle, the SOC command signal is configured to transition synchronously with the CLK signal from a first logical value to a second logical value subsequent to the start of the sample-hold cycle. In response to the second logical value of the SOC command signal, the sample/hold module 104 is configured to sample the analog signal y(t) thereby generating prior to the end of the sample-hold cycle a positive sampled analog quantity $V_A$ indicative of the value of the analog signal y(t) during the sample-hold cycle. The SOC command signal is further configured to transition synchronously with the CLK signal back to the first logical value subsequent to the start of the cycle following the sample-hold cycle.

The N consecutive cycles of the CLK signal following a particular sample-hold cycle will be hereinafter referred to collectively as "convert-multiply cycles" or individually as "a convert-multiply cycle", wherein parameter N is a positive nonzero integer that may have typical values 4, 8, 12, or 16. During a sequence of N consecutive convert-multiply cycles following a particular sample-hold cycle, the SOC command signal is configured to remain at the first logical value. In response to the first logical value of the SOC command signal the sample/hold module 104 is configured to hold the sampled analog quantity $V_A$ generated prior to the end of the sample-hold cycle such that the value thereof is kept substantially unchanged throughout the N consecutive convert-multiply cycles. The SOC command signal may again transition synchronously with the CLK signal to the second logical value subsequent to the start of a later sample-hold cycle following the N consecutive convert-multiply cycles. The sampled analog quantity $V_A$ during any sequence of N consecutive convert-multiply cycles will be referred to hereinafter as "the sampled and held analog quantity."

The SAR module 106 receives the CLK signal and the SOC command signal. When transitioning from a particular sample-hold cycle to a corresponding first convert-multiply cycle, the SAR module 106 may be logically configured to initialize synchronously with the CLK signal in response to the change in the logical value of the SOC command signal. The SAR module 106 is further logically configured to generate a value for an N-bit first digital word D[N−1:0] prior to the end of each convert-multiply cycle by resolving the logical value of each bit of the first digital word D[N−1:0] in succession starting with the most significant bit D[N−1] during the first convert-multiply cycle and concluding with the least significant bit D[0] during the N-th convert-multiply cycle.

The set of N bits making up the first digital word D[N−1:0] whose value is generated by the SAR module 106 prior to the end of any given convert-multiply cycle comprises two subsets of bits. One subset comprises one or more bits from the first digital word D[N−1:0] whose logical values are in a resolved state by the end of the given convert-multiply cycle and remain unchanged during the succeeding convert-multiply cycles following the given convert-multiply cycle. Another subset comprises zero or more bits from the first digital word D[N−1:0] whose logical values are in an unresolved state by the end of the given convert-multiply cycle and will be resolved during the succeeding convert-multiply cycles following the given convert-multiply cycle. Accordingly, the value for the first digital word D[N−1:0] generated by the SAR module 106 prior to the end of any given convert-multiply cycle is determined by the subset of bits of the first digital word D[N−1:0] comprising bits whose logical values are resolved. The N-th value for the first digital word D[N−1:0] generated prior to the end of the N-th convert-multiply cycle is indicative of the sampled and held analog quantity $V_A$ since each of the N bits of the first digital word D[N−1:0] whose value is generated by the SAR module 106 prior to the end of the N-th convert-multiply cycle belong to the subset comprising bits whose logical values are resolved.

To resolve the logical value of each bit of the first digital word D[N−1:0], the SAR module 106 generates a value for an N-bit estimated digital word E[N−1:0] during each convert-multiply cycle. The most significant bit and least significant bit of the estimated digital word E[N−1:0] is E[N−1] and E[0], respectively. The value for the estimated digital word E[N−1:0] during any given convert-multiply cycle is formed by applying a logical '1' value to the bit of the first digital word D[N−1:0] whose logical value is being resolved during the given convert-multiply cycle.

The DAC module 108 receives an analog reference $V_{REF}$ having a substantially unchanging value in addition to the estimated digital word E[N−1:0] whose value is generated by the SAR module 106 during each convert-multiply cycle. The DAC module 108 is configured to generate a value for an estimated analog quantity $V_E$ during each convert-multiply cycle. The value for the estimated analog quantity $V_E$ generated by the DAC module 108 during any given convert-multiply cycle is indicative of the estimated digital word E[N−1:0] whose value was generated by the SAR module 106 during the given convert-multiply cycle and is formed by processing the value of the analog reference $V_{REF}$ in combination with the value for the estimated digital word E[N−1:0] generated during the given convert-multiply cycle.

In response to the SAR module 106 generating the first value for the estimated digital word E[N−1:0] during the first convert-multiply cycle by applying a logical '1' value to the unresolved most significant bit D[N−1] of the first digital word D[N−1:0], the DAC module 108 generates the first value for the estimated analog quantity $V_E$ during the first convert-multiply cycle approximately equal to one-half the value of the positive analog reference $V_{REF}$. In response to the SAR module 106 generating the second value for the estimated digital word E[N−1:0] during the second convert-multiply cycle by applying a logical '1' value to the unresolved bit D[N−2] of the first digital word D[N−1:0] having positional significance $2^{N-2}$, the DAC module 108 generates the second value for the estimated analog quantity $V_E$ during the second convert-multiply cycle equal to either one-fourth or three-fourths the value of the positive analog reference $V_{REF}$, depending on resolved logical value of the most significant bit D[N−1] of the first digital word D[N−1:0]. The operative interactions between the SAR module 106 and the DAC module 108 proceed accordingly for the remaining convert-multiply cycles.

The CMP module 110 receives the sampled and held analog quantity $V_A$ generated by the sample/hold module 104 in addition to the estimated analog quantity $V_E$ whose value is generated by the DAC module 108 during each convert-multiply cycle. The CMP module 110 is configured to compare the sampled and held analog quantity $V_A$ to each value for the estimated analog quantity $V_E$ generated by the DAC module 108 thereby generating a logical value for a comparison result VLD during each convert-multiply cycle. The CMP module 110 may be configured to generate a logical '0' value for the comparison result VLD during any given convert-multiply cycle if the estimated analog quantity $V_E$ generated during the given convert-multiply cycle overvalues the sampled and held analog quantity $V_A$, else the CMP module 110 generates a logical '1' value for the comparison result VLD during the given convert-multiply cycle. Conversely, the CMP module 110 may be configured to generate a logical '1' value for the comparison result VLD during any given convert-multiply cycle if the estimated analog quantity $V_E$ generated during the given convert-multiply cycle overvalues the sampled and held analog quantity $V_A$, else the CMP module 110 generates a logical '0' value for the comparison result VLD during the given convert-multiply cycle. Irrespective of the manner in which the comparison result VLD is encoded, the logical value for the comparison result VLD generated during any given convert-multiply cycle is indicative of the resolved logical value of the bit of the first digital word D[N−1:0] whose logical value is being resolved during the given convert-multiply cycle.

The SAR module 106 receives the comparison result VLD whose logical value is generated by the CMP module 110 during each convert-multiply cycle. The SAR module 106 generates the value for the first digital word D[N−1:0] prior to the end of each convert-multiply cycle by successively resolving the logical value of each bit of the first digital word D[N−1:0] in response to, and upon the arrival of, the logical value for the comparison result VLD generated by the CMP module 110 during each convert-multiply cycle. During any given convert-multiply cycle, the SAR module 106 may be logically configured to utilize the non-complemented or complemented logical value for the comparison result VLD generated during the given convert-multiply cycle as the resolved logical value of the bit of the first digital word D[N−1:0] whose logical value is being resolved during the given convert-multiply cycle.

In accordance with the sequential analog/digital conversion processing performed by the SAR-ADC module 102, the value for the first digital word D[N−1:0] is refined in succession throughout a particular sequence of N consecutive convert-multiply cycles by processing in succession the sampled and held analog quantity $V_A$ whose value was generated prior to the end of the sample-hold cycle preceding the sequence of N consecutive convert-multiply cycles. To indicate that the SAR-ADC module 102, and accordingly the apparatus 100, will complete the sequential analog/digital conversion at the end of the N-th convert-multiply cycle thus having generated prior to the end of the N-th convert-multiply cycle the N-th value for the first digital word D[N−1:0] indicative of the sampled and held analog quantity $V_A$, the SAR module 106 is further logically configured to generate an end-of-conversion command signal EOC. The EOC command signal has a first logical value during the N-th convert-multiply cycle and a second logical value during the preceding convert-multiply cycles.

Although the foregoing description of the SAR-ADC module 102 was discussed in the context of refining the value of the first digital word D[N−1:0] during each convert-multiply cycle by resolving the logical value of one bit thereof, those knowledgeable in the art know that sequential converters of the successive approximation type may be configured to resolve the logical value of more than one bit of the digital output per conversion cycle. Accordingly, it will be apparent to those knowledgeable in the art how to adapt the SAR-ADC module 102 such that more than one bit of the digital output is resolved per conversion cycle.

The SSM module 112 receives the CLK signal, the SOC command signal, an M-bit digital operand A[M−1:0], and the comparison result VLD whose logical value is generated by the CMP module 110 during each convert-multiply cycle. The most significant bit and least significant bit of the digital operand A[M−1:0] is A[M−1] and A[0], respectively. The parameter M is a positive nonzero integer that may have typical values 4, 8, 12, or 16. When transitioning from a particular sample-hold cycle to a corresponding first convert-multiply cycle, the SSM module 112 may be logically configured to initialize synchronously with the CLK signal, which may include capturing a value of the digital operand A[M−1:0], in response to the change in the logical value of the SOC command signal. The SSM module 112 generates a digital product prior to the end of the N-th convert-multiply cycle whose value is equivalent to the product formed by multiplying the digital operand A[M−1:0] with the N-th value of the first digital word D[N−1:0] indicative of the sampled and held analog quantity $V_A$.

To form the digital product, the SSM module 112 is logically configured to generate a value for an (N+M)-bit second digital word P[N+M−1:0] prior to the end of each convert-multiply cycle. The most significant bit and least significant bit of the second digital word P[N+M−1:0] is P[N+M−1] and P[0], respectively. The value for the second digital word P[N+M−1:0] generated by the SSM module 112 prior to the end of any given convert-multiply cycle is equal to the value for the summation of partial products corresponding to the digital operand A[M−1:0] and each bit belonging to the subset of resolved logical bit values of the first digital word D[N−1:0] whose value is generated prior to the end of the same given convert-multiply cycle. Accordingly, the N-th value for the second digital word P[N+M−1:0] generated by the SSM module 112 prior to the end of the N-th convert-multiply cycle is equal the value for the summation of partial products corresponding to the digital operand A[M−1:0] and all N bits belonging to the subset of resolved logical bit values of the first digital word D[N−1:0] whose value is generated prior to the end of the same N-th convert-multiply cycle. Furthermore, the EOC command signal generated by the SAR-ADC module 102 also serves to indicate the generation of the N-th value for the second digital word P[N+M−1:0] prior to the end of the N-th convert-multiply cycle equal to the digital product.

To generate the value for the second digital word P[N+M−1:0] prior to the end of any given convert-multiply cycle, the SSM module 112 assumes that the bit of the first digital word D[N−1:0] whose logical value is being resolved by the SAR-ADC module 102 during the given convert-multiply cycle will be resolved to a logical '1' value rather than waiting for the SAR-ADC module 102 to resolve the logical value of the bit prior to the end of the given convert-multiply cycle. Consequently, the SSM module 112 is logically configured to predict a value for the partial product corresponding to the digital operand A[M−1:0] and the bit whose logical value is being resolved during any given convert-multiply cycle thereby generating a value for a speculative partial product subsequent to the start of each convert-multiply cycle. In accordance with an embodiment, the value for the speculative partial product generated during any given convert-multiply cycle is equal to the immediately available value of the digital operand A[M−1:0] weighted by the positional significance of the bit of the first digital word D[N−1:0] whose logical value is being resolved during the given convert-multiply cycle. In accordance with another embodiment, the value for the speculative partial product generated during any given convert-multiply cycle is simply equal to the immediately available value of the digital operand A[M−1:0].

Furthermore, the SSM module 112 is logically configured to predict a value for the summation of partial products corresponding to the digital operand A[M−1:0] and each bit belonging to the subset of resolved logical bit values of the first digital word D[N−1:0] whose value will be generated prior to the end of any given convert-multiply cycle thereby generating a value for a speculative summation of partial products during each convert-multiply cycle. In accordance with an embodiment, the value for the speculative summation generated during any given convert-multiply cycle is formed by adding the value for the speculative partial product generated subsequent to the start of the given convert-multiply cycle with the value for the second digital word P[N+M−1:0] generated by the SSM module 112 prior to the end of the convert-multiply cycle preceding the given convert-multiply cycle. In accordance with another embodiment, the value for the speculative summation generated during any given convert-multiply cycle is formed by adding the value for the speculative partial product generated subsequent to the start of the given convert-multiply cycle to the value for the second digital word P[N+M−1:0] generated prior to the end of the convert-multiply cycle preceding the given convert-multiply cycle and weighted by two.

The SSM module 112 generates the value for the second digital word P[N+M−1:0] prior to the end of the each convert-multiply cycle in response to, and upon the arrival of, the logical value for the comparison result VLD generated by the CMP module 110 during each convert-multiply cycle. In accordance with an embodiment, in response to the comparison result VLD generated during any given convert-multiply cycle, the value for the second digital word P[N+M−1:0] generated prior to the end of the given convert-multiply cycle is selected from either the value for the speculative summation generated during the given convert-multiply cycle or the value for the second digital word P[N+M−1:0] generated prior to the end of the convert-multiply cycle preceding the given convert-multiply cycle. In accordance with another embodiment, in response to the comparison result VLD generated during any given convert-multiply cycle, the value for the second digital word P[N+M−1:0] generated prior to the end of the given convert-multiply cycle is selected from either the value for the speculative summation generated during the given convert-multiply cycle or the value for the second digital word P[N+M−1:0] generated prior to the end of the convert-multiply cycle preceding the given convert-multiply cycle and weighted by two. Consequently, the value for the second digital word P[N+M−1:0] generated prior to the end of any given convert-multiply cycle has the proper value for the summation of partial products corresponding to the digital operand A[M−1:0] and each bit belonging to the subset of resolved logical bit values of the first digital word D[N−1:0] whose value is generated prior to the end of the same given convert-multiply cycle.

The cycle latency of the apparatus 100 for generating the N-th value of the first digital word D[N−1:0] indicative of the sampled and held analog quantity $V_A$ and the N-th value of the second digital word P[N+M−1:0] equal to the digital product is N+1 cycles of the CLK signal. One cycle of the CLK signal is dedicated to sampling the analog input signal y(t) and initializing the SAR module 106 and SSM module 112. The following N cycles of the CLK signal are dedicated to performing sequential analog/digital conversion and multiplication, wherein the multiplication is performed speculatively as described herein.

The processing performed by the apparatus 100 not only exploits coarse-grained computational parallelism associated with sequential analog/digital conversion and multiplication across a particular sequence of N consecutive convert-multiply cycles, but the speculative processing performed by the apparatus 100 via the SSM module 112 also exploits fine-grained computational parallelism during each convert-multiply cycle believed to be heretofore unrecognized. Particularly, the apparatus 100 performs sequential analog/digital conversion and multiplication by parallelizing a substantial portion of the conversion and multiplication processing during any given convert-multiply cycle thereby overlapping the time consumed by the SAR-ADC module 102 for determining the manner in which to refine the value of the first digital word D[N−1:0] with the time consumed by the SSM module 112 for generating the value for the speculative summation of partial products.

The substantial increase in parallelism resulting from the speculative processing performed by the SSM module 112 may enable the apparatus 100 to generate the value for the second digital word P[N+M−1:0] prior to the end of each convert-multiply cycle while substantially maintaining the operative frequency at which the SAR-ADC module 102 refines the value of the first digital word D[N−1:0]. Furthermore, by exploiting fine-grained parallelism per convert-multiply cycle through speculation, the multiplication processing may not substantially impeded the operative frequency at which the SAR-ADC module 102 refines the value of the first digital word D[N−1:0] without having to temporarily latch or store intermediate multiplication results such as partial products. Accordingly, the operative frequency of the apparatus 100 can be substantially determined by the operative frequency at which the SAR-ADC module 102 refines the value of the first digital word D[N−1:0].

Although the foregoing description of the SSM module 112 assumes the SAR-ADC module 102 refines the value of the first digital word D[N−1:0] during each convert-multiply cycle by resolving the logical value of one bit thereof, the SSM module 112 can be adapted accordingly when coupled to a sequential converter of the successive approximation type configured to resolve the logical value of more than one bit of the digital output per conversion cycle. Particularly, alternative embodiments of the SSM module 112 would be configured to generate, during each conversion cycle, values for a plurality of speculative partial products and a value for a speculative summation of partial products corresponding to each speculative partial product, wherein each speculative summation of partial products is formed by combining the value of a corresponding speculative partial product and the value for the second digital word P[N+M−1:0] generated during the conversion cycle preceding the given conversion cycle. Per conversion cycle, the number of speculative partial products and speculative summations may be each one less than two raised to a power equal to the number of bits the sequential converter resolves per conversion cycle. During a given conversion cycle, upon receiving from the converter a determination indicating how the digital output would be refined, the SSM module 112 would generate the value for the second digital word P[N+M−1:0] prior to the end of the given conversion cycle by selecting from either the value of one speculative summation generated during the given conversion cycle or the value for the second digital word P[N+M−1:0] generated during the conversion cycle preceding the given conversion cycle and weighted by either one or two raised to an integer power equal to the number of bits the sequential converter resolves per conversion cycle, depending on the manner in which the values of the speculative partial products are formed.

Figure 2A:
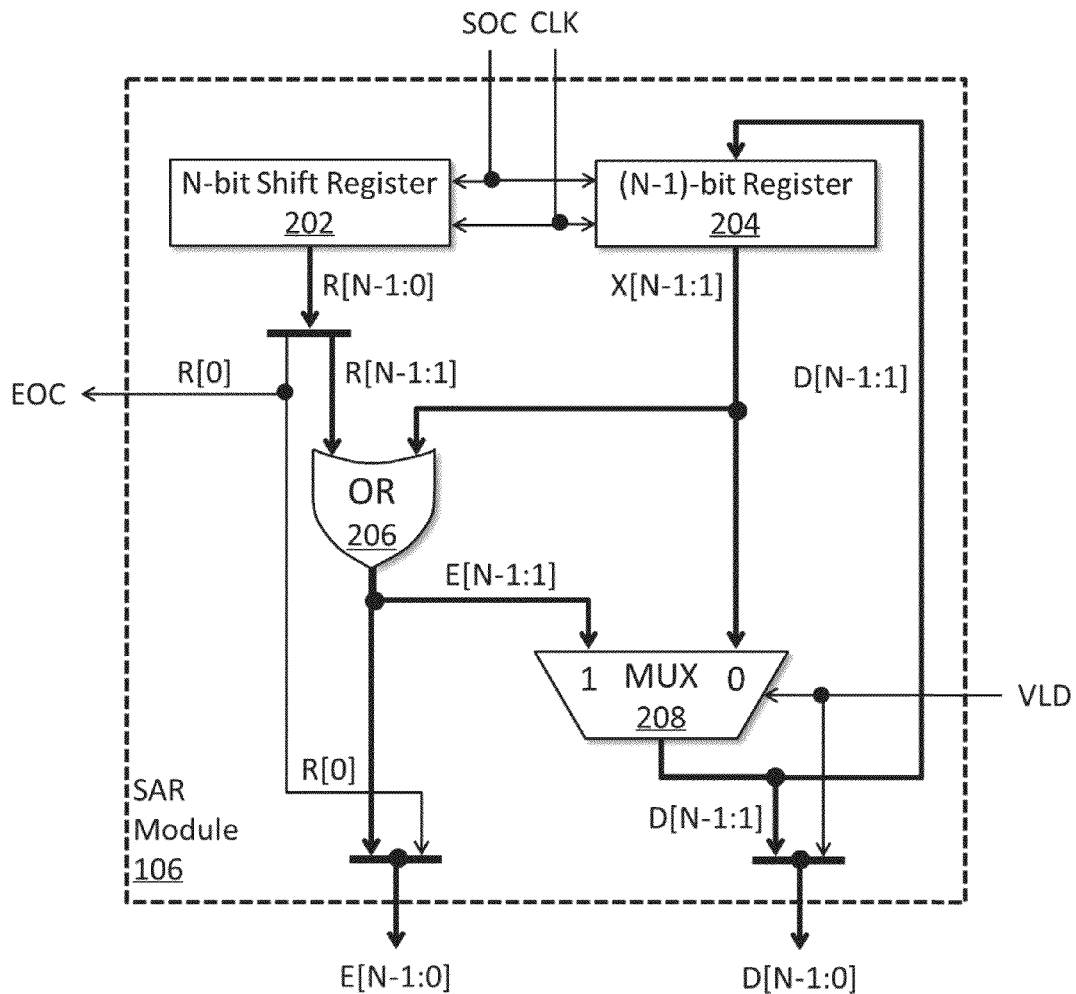
FIG. 2a shows in detail a logic configuration for a successive approximation register module in accordance with an embodiment.

FIG. 2a: A Logic Configuration of the SAR Module

FIG. 2a shows in detail a logic configuration of the SAR module 106 shown in FIG. 1 in accordance with an embodiment. The logic configuration comprises an N-bit shift register module 202, an (N−1)-bit approximation register module 204, an (N−1)-bit first OR logic module 206, and an (N−1)-bit multiplexer module 208.

The shift register module 202 receives the CLK signal and the SOC command signal and is logically configured to generate a value for an N-bit count word R[N−1:0] subsequent to the start of each convert-multiply cycle. The most significant bit and least significant bit of the count word R[N−1:0] is R[N−1] and R[0], respectively. When transitioning from a particular sample-hold cycle to a corresponding first convert-multiply cycle, the shift register module 202 is logically configured to reset synchronously with the CLK signal in response to the change in the logical value of the SOC command signal thereby generating subsequent to the start of the first convert-multiply cycle the first value for the count word R[N−1:0] equal to $2^{N-1}$. The shift register module 202 generates the remaining N−1 values for the count word R[N−1:0] by successively shifting the bits of the count word R[N−1:0] to the right by one bit position during each of the N−1 convert multiply cycles following the first convert-multiply cycle. Accordingly, throughout a particular sequence of N consecutive convert-multiply cycles, the shift register module 202 generates the sequence of N values $\{2^{N-1}, 2^{N-2}, \ldots, 2^1, 2^0\}$ for the count word R[N−1:0]. Subsequent to the start of any given convert-multiply cycle, the value generated for the count word R[N−1:0] indicates the positional significance of the bit of the first digital word D[N−1:0] whose logical value is being resolved during the given convert-multiply cycle. Furthermore, the logical value for the least significant bit R[0] of the count word R[N−1:0] is utilized as the logical value for the EOC command signal. Accordingly, the EOC command signal has a logical '1' value during the N-th convert-multiply cycle and a logical '0' value during the preceding convert-multiply cycles.

The SAR module 106 shown in FIG. 2a is logically configured to generate a value for an (N−1)-bit portion of the N-bit count word R[N−1:0] subsequent to the start of each convert-multiply cycle. The (N−1)-bit portion of the N-bit count word R[N−1:0] will be referred to hereinafter as "the most significant portion of the count word" and designated hereinafter as R[N−1:1]. The most significant portion of the count word R[N−1:1] comprises bits from the N-bit count word R[N−1:0] ranging from the most significant bit R[N−1] down to the bit R[1] having positional significance $2^1$.

The approximation register module 204 receives the CLK signal and the SOC command signal. Furthermore, the multiplexer module 208 generates a value for an (N−1)-bit portion of the N-bit first digital word D[N−1:0] prior to the end of each convert-multiply cycle which is received prior to the end of each convert multiply-cycle by the approximation register module 204, wherein a value for the N-bit first digital word D[N−1:0] is generated by the SAR module 106 shown in FIG. 2a prior to the end of each convert-multiply cycle. The (N−1)-bit portion of the N-bit first digital word D[N−1:0] will be referred to hereinafter as "the most significant portion of the first digital word" and designated hereinafter as D[N−1:1]. The most significant portion of the first digital word D[N−1:1] comprises bits from the N-bit first digital word D[N−1:0] ranging from the most significant bit D[N−1] down to the bit D[1] having positional significance $2^1$.

The approximation register module 204 is logically configured to generate a value for an (N−1)-bit approximation word X[N−1:1] subsequent to the start of each convert-multiply cycle. The most significant bit of the approximation word X[N−1:1] is X[N−1] and the bit of the approximation word X[N−1:1] having positional significance $2^1$ is X[1]. When transitioning from a particular sample-hold cycle to a corresponding first convert-multiply cycle, the approximation register module 204 is logically configured to reset synchronously with the CLK signal in response to the change in the logical value of the SOC command signal thereby generating subsequent to the start of the first convert-multiply cycle the first value for the approximation word X[N−1:1] equal to zero. Upon reset, the approximation register module 204 is logically configured to latch or store the value for the most significant portion of the first digital D[N−1:1] generated by the multiplexer module 208 prior to the end of any given convert-multiply cycle thereby generating a value for the approximation word X[N−1:1] subsequent to the start of the convert-multiply cycle following the given convert-multiply cycle equal to the latched or stored value of the most significant portion of the first digital D[N−1:1]. Accordingly, the approximation register module 204 generates a value for the approximation word X[N−1:1] subsequent to the start of each convert-multiply cycle. Since the most significant portion of the first digital word D[N−1:1] is latched or stored by the approximation register module 204 during each convert-multiply cycle, what would be the least significant storage location of the approximation register module 204 that would latch or store the least significant bit D[0] of the N-bit first digital word D[N−1:0] is superfluous and may not necessitate implementation. Therefore, the approximation register module 204 has the bit width of N−1 rather than the bit width of N.

The first OR logic module 206 receives the most significant portion of the count word R[N−1:1] whose value is generated by the SAR module 106 shown in FIG. 2a subsequent to the start of each convert-multiply cycle in addition to the approximation word X[N−1:1] whose value is generated by the approximation register module 204 subsequent to the start of each convert-multiply cycle. The first OR logic module 206 is configured to logically OR in a bitwise fashion the most significant portion of the count word R[N−1:1] with the approximation word X[N−1:1] thereby generating a value for an (N−1)-bit portion of the N-bit estimated digital word E[N−1:0] during each convert-multiply cycle, wherein a value for the N-bit estimated digital word E[N−1:0] is generated by the SAR module 106 shown in FIG. 2a during each convert-multiply cycle. The (N−1)-bit portion of the N-bit estimated digital word E[N−1:0] will be referred to hereinafter as "the most significant portion of the estimated digital word" and designated hereinafter as E[N−1:1]. The most significant portion of the estimated digital word E[N−1:1] comprises bits from the N-bit estimated digital word E[N−1:0] ranging from the most significant bit E[N−1] down to the bit E[1] having positional significance $2^1$. Since the least significant storage location of the approximation register module 204 is superfluous, the first OR logic module 206 has the bit-width of N−1 rather than a bit-width of N.

The SAR module 106 shown in FIG. 2a is logically configured to concatenate the least significant bit R[0] of the count word R[N−1:0] adjacent to the bit E[1] of the most significant portion of the estimated digital word E[N−1:1] thereby generating a value for the N-bit estimated digital word E[N−1:0] during each convert-multiply cycle. As a consequence of the processing performed by the first OR logic module 206 in combination with the concatenation performed by the SAR module 106 shown in FIG. 2a for generating the value of the N-bit estimated digital word E[N−1:0] during any given convert-multiply cycle, a logical '1' value is applied to the bit of the first digital word D[N−1:0] whose logical value is being resolved during the given convert-multiply cycle having positional significance indicative of the value for the count word R[N−1:0] generated during the given convert-multiply cycle.

The multiplexer module 208 receives the comparison result VLD whose logical value is generated by the CMP module 110 (shown in FIG. 1) during each convert-multiply cycle, the most significant portion of the estimated digital word E[N−1:1] whose value is generated by the first OR logic module 206 during each convert-multiply cycle, and the approximation word X[N−1:1] whose value is generated by the approximation register module 204 subsequent to the start of each convert-multiply cycle. The multiplexer module 208 is logically configured to generate the value for the most significant portion of the first digital word D[N−1:1] prior to the end of each convert-multiply cycle in response to, and upon the arrival of, the logical value for the comparison result VLD generated during each corresponding convert-multiply cycle indicating whether or not the sampled and held analog quantity $V_A$ was undervalued.

If the logical value for the comparison result VLD generated during any given convert-multiply cycle indicates the sampled and held analog quantity $V_A$ was overvalued, then the multiplexer module 208 is logically configured to select the approximation word X[N−1:1] thereby generating prior to the end of the given convert-multiply cycle the value for the most significant portion of the first digital word D[N−1:1] equal to the value for the approximation word X[N−1:1] generated subsequent to the start of the given convert-multiply cycle. Alternatively, if the logical value for the comparison result VLD generated during any given convert-multiply cycle indicates the sampled and held analog quantity $V_A$ was not overvalued, then the multiplexer module 208 is logically configured to select the most significant portion of the estimated digital word E[N−1:1] thereby generating prior to the end of the given convert-multiply cycle the value for the most significant portion of the first digital word D[N−1:1] equal to the value for the most significant portion of the estimated digital word E[N−1:1] generated during the given convert-multiply cycle. Since the least significant storage location of the approximation register module 204 is superfluous, the multiplexer module 208 has the bit-width of N−1 rather than a bit width of N.

The SAR module 106 shown in FIG. 2a is logically configured to concatenate the comparison result VLD adjacent to the bit D[1] of the most significant portion of the first digital word D[N−1:1] thereby generating a value for the N-bit first digital word D[N−1:0] prior to the end of each convert-multiply cycle. As a consequence of the processing performed by the multiplexer module 208 in combination with the concatenation performed by the SAR module 106 shown in FIG. 2a for generating the value of the N-bit first digital word D[N−1:0] during any given convert-multiply cycle, the logical value of the bit of the N-bit first digital word D[N−1:0] whose positional significance is indicated by the value of the count word R[N−1:0] generated subsequent to the start of the given convert-multiply cycle becomes resolved.

In accordance with the processing performed by the SAR module 106 shown in FIG. 2a, the value for the first digital word D[N−1:0] is refined throughout a particular sequence of N consecutive convert-multiply cycles in response to each value of the comparison result VLD. Upon completing N consecutive refinements, the N-th value for the first digital word D[N−1:0] generated by the SAR module 106 shown in FIG. 2a prior to the end of the N-th convert-multiply cycle becomes indicative of the sampled and held analog quantity $V_A$. Although the SAR module 106 shown in FIG. 2a is described in the context of analog/digital conversion processing, those knowledgeable in the art will appreciate that the SAR module 106 shown in FIG. 2a may be utilized in other applications which employ the successive approximation technique to generate a particular result, including, but not limited to, arithmetic processing applications performing certain types of arithmetic functions.

Figure 2B:
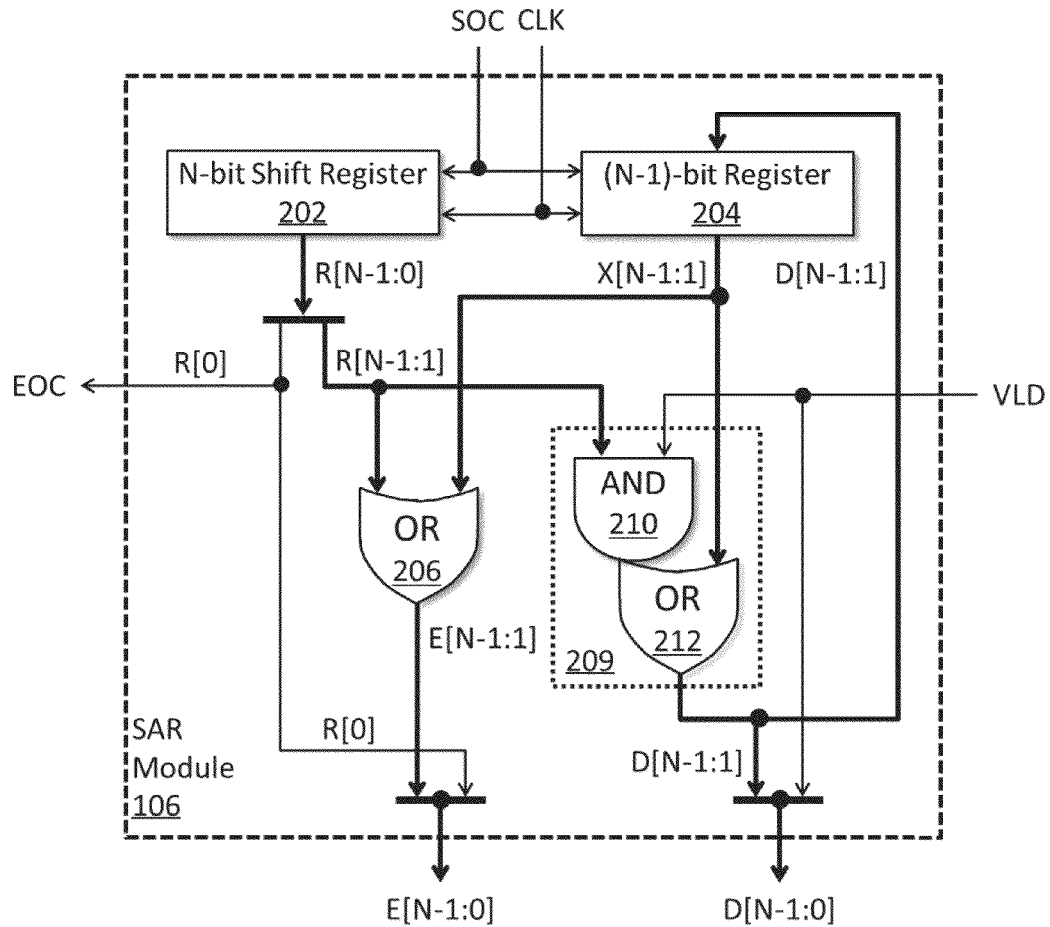
FIG. 2b shows in detail another logic configuration for a successive approximation register module in accordance with an embodiment.

FIG. 2b: Another Logic Configuration of the SAR Module

FIG. 2b shows in detail another logic configuration of the SAR module 106 shown in FIG. 1 in accordance with an embodiment. The logic configuration for the SAR module 106 shown in FIG. 2b is similar in structure and operation to the logic configuration of the SAR module 106 shown in FIG. 2a. Particularly, the logic configurations for the SAR module 106 shown in FIG. 2a and FIG. 2b both comprise the N-bit shift register module 202, the (N−1)-bit approximation register module 204, and the (N−1)-bit first OR logic module 206. The SAR module 106 shown in FIG. 2b comprises an (N−1)-bit AND-OR logic module 209 which replaces the (N−1)-bit multiplexer module 208 of the SAR module 106 shown in FIG. 2a. The AND-OR logic module 209 of the SAR module 106 shown in FIG. 2b comprises an (N−1)-bit AND logic module 210 and an (N−1)-bit second OR logic module 212.

The AND logic module 210 receives the most significant portion of the count word R[N−1:1] whose value is generated by the SAR module 106 shown in FIG. 2b subsequent to the start of each convert-multiply cycle in addition to the comparison result VLD whose logical value is generated by the CMP module 110 (shown in FIG. 1) during each convert-multiply cycle. The AND logic module 210 is configured to logically AND each bit comprising the most significant portion of the count word R[N−1:1] with the comparison result VLD thereby generating a value for an (N−1)-bit intermediate word (not shown) during each convert-multiply cycle. The second OR logic module 212 receives the (N−1)-bit intermediate word (not shown) whose value is generated by the AND logic module 210 during each convert-multiply cycle in addition to the approximation word X[N−1:1] whose value is generated by the approximation register module 204 subsequent to the start of each convert-multiply cycle. The second OR logic module 212 is configured to logically OR in a bitwise fashion the intermediate word (not shown) with the approximation word X[N−1:1] thereby generating the value for the most significant portion of the first digital word D[N−1:1] prior to the end of each convert-multiply cycle.

Since the least significant storage location of the approximation register module 204 is superfluous, the AND-OR module 209 has the bit-width of N−1 rather than a bit-width of N. Accordingly, the AND logic module 210 and the second OR logic module 212 each have the bit-width of N−1 rather than a bit-width of N. Furthermore, like the SAR module 106 shown in FIG. 2a, those knowledgeable in the art will appreciate that the SAR module 106 shown in FIG. 2b may also be utilized in other applications which employ the successive approximation technique to generate a particular result, such as arithmetic processing applications performing certain types of arithmetic functions.

Figure 3:
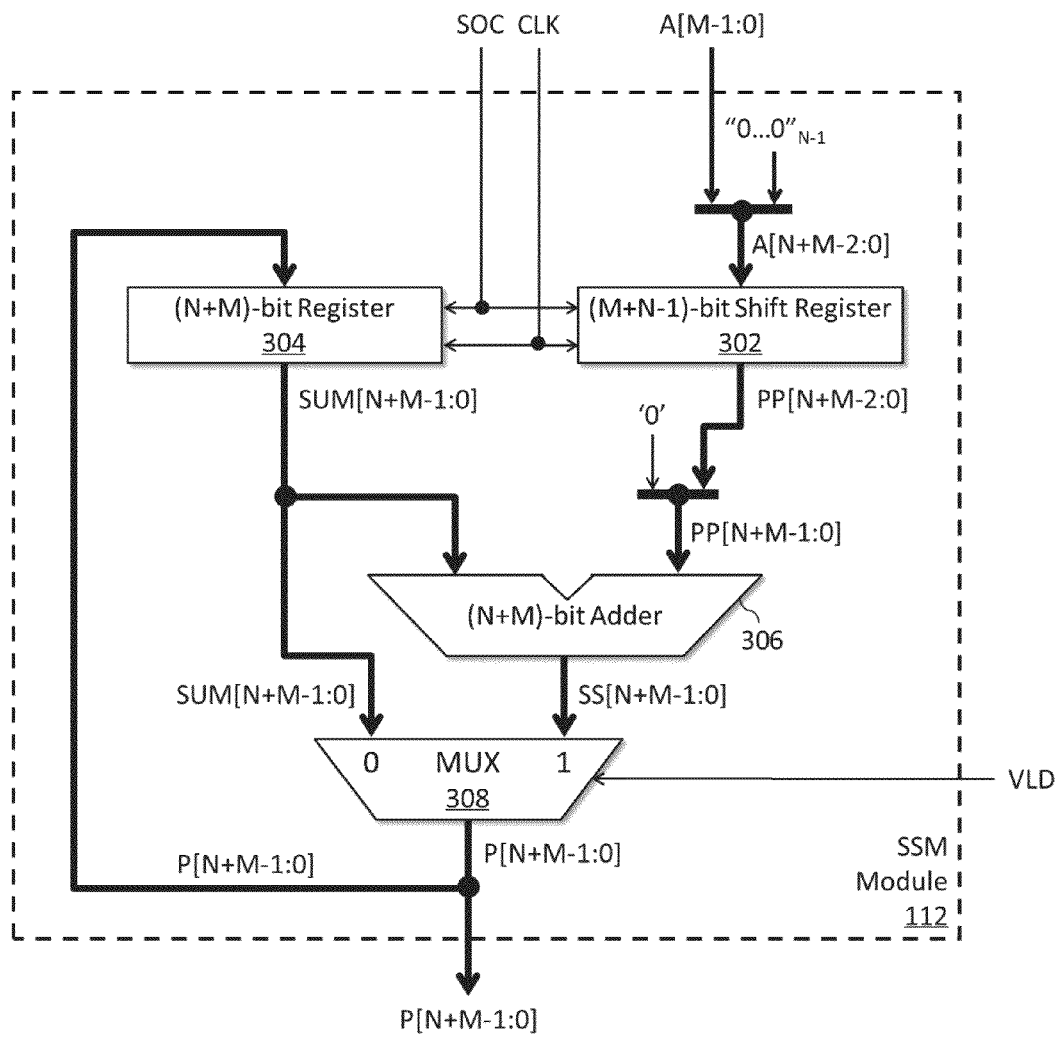
FIG. 3 shows in detail a logic configuration for a speculative sequential multiplier module in accordance with an embodiment.

FIG. 3: A Logic Configuration of the SSM Module

FIG. 3 shows in detail a logic configuration of the SSM module 112 shown in FIG. 1 in accordance with an embodiment. The logic configuration comprises an (N+M−1)-bit shift register module 302, an (N+M)-bit summation register module 304, an (N+M)-bit addition module 306, and an (N+M)-bit multiplexer module 308. The SSM module 112 shown in FIG. 3 is configured in a manner which assumes the first digital word D[N−1:0], the digital operand A[M−1:0], and the second digital word P[N+M−1:0] are each encoded using the unsigned binary encoding scheme well known by those knowledgeable in the art. Furthermore, the SSM module 112 shown in FIG. 3 is configured in a manner which assumes the value of the first digital word D[N−1:0] is refined by resolving during each convert-multiply cycle a single bit thereof starting from the most significant bit D[N−1].

The SSM module 112 shown in FIG. 3 receives the M-bit digital operand A[M−1:0] and generates an (N+M−1)-bit digital operand A[N+M−2:0]. The (N+M−1)-bit digital operand A[N+M−2:0] is formed by concatenating an (N−1)-bit word, designated as "0 . . . 0"$_{N-1}$ and having a constant value of zero, adjacent to the least significant bit A[0] of the M-bit digital operand A[M−1:0]. The most significant bit and least significant bit of the (N+M−1)-bit digital operand A[N+M−2:0] is A[N+M−2] and A[0], respectively. The value for the (N+M−1)-bit digital operand A[N+M−2:0] is equal to the value of the M-bit digital operand A[M−1:0] weighted by a factor of $2^{N-1}$, i.e. A[N+M−2:0]=A[M−1:0]×$2^{N-1}$.

The shift register module 302 receives the CLK signal, the SOC command signal, and the (N+M−1)-bit digital operand A[N+M−2:0] whose value is generated by the SSM module 112 shown in FIG. 3. The shift register module 302 is logically configured to generate a value for an (N+M−1)-bit speculative partial product PP[N+M−2:0] subsequent to the start of each convert-multiply cycle. The most significant bit and least significant bit of the (N+M−1)-bit speculative partial product PP[N+M−2:0] is PP[N+M−2] and PP[0], respectively. When transitioning from a particular sample-hold cycle to a corresponding first convert-multiply cycle, the shift register module 302 is logically configured to latch or store synchronously with the CLK signal the (N+M−1)-bit digital operand A[N+M−2:0] in response to the change in the logical value of the SOC command signal thereby generating subsequent to the start of the first convert-multiply cycle the first value for the (N+M−1)-bit speculative partial product PP[N+M−2:0] equal to A[M−1:0]×$2^{N-1}$. The shift register module 302 is logically configured to generate the remaining N−1 values for the (N+M−1)-bit speculative partial product PP[N+M−2:0] by successively shifting the bits of the (N+M−1)-bit speculative partial product PP[N+M−2:0] to the right by one bit position during each of the N−1 convert multiply cycles following the first convert-multiply cycle. Accordingly, throughout any particular sequence of N consecutive convert-multiply cycles, the shift register module 302 generates the sequence of N values {A[M−1:0]×$2^{N-1}$, A[M−1:0]×$2^{N-2}$, . . . , A[M−1:0]×$2^1$, A[M−1:0]×$2^0$} for the (N+M−1)-bit speculative partial product PP[N+M−2:0].

Different values of the (N+M−1)-bit digital operand A[N+M−2:0] may be latched or stored synchronously with the CLK signal by the shift register module 302 each time the SOC command signal changes from the first to the second logical value as part of the apparatus 100 (shown in FIG. 1) transitioning from a particular sample-hold cycle to a corresponding first convert-multiply cycle. Those knowledgeable in the art will appreciate that although the shift register module 302 is included as part of the logic configuration of the SMM module 112 shown in FIG. 3, the shift register module 302 may be superfluous and may not necessitate implementation if there is an alternative means provided for generating the sequence of N values {A[M−1:0]×$2^{N-1}$, A[M−1:0]×$2^{N-2}$, . . . , A[M−1:0]×$2^1$, A[M−1:0]×$2^0$} for the (N+M−1)-bit speculative partial product PP[N+M−2:0] during a particular sequence of N consecutive convert-multiply cycles.

The SSM module 112 shown in FIG. 3 generates a value for an (N+M)-bit speculative partial product PP[N+M−1:0] subsequent to the start of each convert-multiply cycle. The most significant bit and least significant bit of the (N+M)-bit speculative partial product PP[N+M−1:0] is PP[N+M−1] and PP[0], respectively. During any given convert-multiply cycle, the SSM module 112 shown in FIG. 3 forms the (N+M)-bit speculative partial product PP[N+M−1:0] by concatenating a constant logical '0' value adjacent to the most significant bit PP[N+M−2] of the (N+M−1)-bit speculative partial product PP[N+M−2:0] whose value is generated by the shift register module 302 subsequent to the start of the given convert-multiply cycle.

The summation register module 304 receives the CLK signal, the SOC command signal, and the (N+M)-bit second digital word P[N+M−1:0] whose value is generated by the multiplexer module 308 prior to the end of each convert-multiply cycle. The summation register module 304 is logically configured to generate a value for an (N+M)-bit summation word SUM[N+M−1:0] subsequent to the start of each convert-multiply cycle. The most significant bit and least significant bit of the (N+M)-bit summation word SUM[N+M−1:0] is SUM[N+M−1] and SUM[0], respectively. When transitioning from a particular sample-hold cycle to a corresponding first convert-multiply cycle, the summation register module 304 is logically configured to reset synchronously with the CLK signal in response to the change in the logical value of the SOC command signal thereby generating subsequent to the start of the first convert-multiply cycle the first value for the summation word SUM[N+M−1:0] equal to zero.

Upon reset, the summation register module 304 is logically configured to latch or store the value for the second digital word P[N+M−1:0] generated by the multiplexer module 308 prior to the end of any given convert-multiply cycle thereby generating a value for the summation word SUM[N+M−1:0] subsequent to the start of the convert-multiply cycle following the given convert-multiply cycle equal to the latched or stored value of the second digital word P[N+M−1:0]. Accordingly, the summation register module 304 generates a value for the summation word SUM[N+M−1:0] subsequent to the start of each convert-multiply cycle.

The value for the summation word SUM[N+M−1:0] generated during any given convert-multiply cycle is equal to the value for the summation of partial products corresponding to the digital operand A[M−1:0] and each bit belonging to the subset of resolved logical bit values of the first digital word D[N−1:0] whose value was generated by the SAR-ADC module 102 (shown in FIG. 1) prior to the end of the convert-multiply cycle preceding the given convert-multiply cycle. Provided the bit of the first digital word D[N−1:0] whose logical value is being resolved during any given cycle were to be resolved to a logical '0' value prior to the end of the given convert-multiply cycle, the summation word SUM[N+M−1:0] generated subsequent to the start of the given convert-multiply cycle would be equal to the proper value for the summation of partial products corresponding to the digital operand A[M−1:0] and each bit belonging to the subset of resolved logical bit values of the first digital word D[N−1:0] whose value would be generated by the SAR-ADC module 102 (shown in FIG. 1) prior to the end of the given convert-multiply cycle.

The addition module 306 receives the summation word SUM[N+M−1:0] whose value is generated by the summation register module 304 subsequent to the start of each convert-multiply cycle along with the (N+M)-bit speculative partial product PP[N+M−1:0] whose value is generated by the SSM module 112 shown in FIG. 3 subsequent to the start of each convert-multiply cycle. The addition module 306 is logically configured to add the summation word SUM[N+M−1:0] to the (N+M)-bit speculative partial product PP[N+M−1:0] thereby generating a value for an (N+M)-bit speculative summation SS[N+M−1:0] during each convert-multiply cycle. The most significant bit and least significant bit of the speculative summation SS[N+M−1:0] is SS[N+M−1] and SS[0], respectively. Provided the bit of the first digital word D[N−1:0] whose logical value is being resolved during any given cycle were to be resolved to a logical '1' value prior to the end of the given convert-multiply cycle, the value for the speculative summation SS[N+M−1:0] generated during the given convert-multiply cycle would be equal to the proper value for the summation of partial products corresponding to the digital operand A[M−1:0] and each bit belonging to the subset of resolved logical bit values of the first digital word D[N−1:0] whose value would be generated by the SAR-ADC module 102 (shown in FIG. 1) prior to the end of the given convert-multiply cycle.

The addition module 306 may be of the carry look-ahead, parallel prefix, or conditional sum architecture types, or may be constructed from a combination of architecture types thereof. However, in general, any architecture type or combination of architecture types may be utilized for realizing the addition module 306. Nevertheless, those knowledgeable in the art will appreciate that the most significant bit-slice of the addition module 306 may be replaced by a single-bit, two-input exclusive-OR logic module (not shown) as a consequence of the most significant bit PP[N+M−1] of the (N+M)-bit speculative partial product PP[N+M−1:0] always having a constant logical '0' value. Therefore, the bit-width of the addition module 306 may be reduced from the bit-width of N+M down to a bit-width of N+M−1, where the most significant bit-slice of the addition module 306 would be replaced by the single-bit, two-input exclusive-OR logic module (not shown). Moreover, those knowledgeable in the art will recognize that a multi-function arithmetic logic unit capable of adding at least two operands may replace the addition module 306.

Predicting the value of the partial product during any given convert-multiply cycle by assuming that the bit of the first digital word D[N−1:0] whose logical value is being resolved during the given convert-multiply cycle will be resolved to a logical '1' value rather than waiting to receive the resolved logical value for the bit in order to generate the proper value for the partial product for the given convert-multiply cycle allows for an elimination of a AND module typically utilized for generating partial products. The elimination of the AND logic module provides additional processing time for generating the value for the speculative summation SS[N+M−1:0] during any given convert-multiply cycle prior to receiving during the same given convert-multiply cycle the logical value for the comparison result VLD generated by the CMP module 110 (shown in FIG. 1).

The multiplexer module 308 receives the comparison result VLD whose value is generated by the CMP module 110 (shown in FIG. 1) during each convert-multiply cycle, the summation word SUM[N+M−1:0] whose value is generated by the summation register module 304 subsequent to the start of each convert-multiply cycle, and the speculative summation SS[N+M−1:0] whose value is generated by the addition module 306 during each convert-multiply cycle. The multiplexer module 308 is logically configured to generate the value for the second digital word P[N+M−1:0] prior to the end of each convert-multiply cycle in response to, and upon the arrival of, the logical value for the comparison result VLD generated during each convert-multiply cycle indicating whether or not the sampled and held analog quantity $V_A$ was overvalued.

If the logical value for the comparison result VLD generated during any given convert-multiply cycle indicates the sampled and held analog quantity $V_A$ was overvalued, then the multiplexer module 308 is logically configured to select the summation word SUM[N+M−1:0] thereby generating prior to the end of the given convert-multiply cycle the value for the second digital word P[N+M−1:0] equal to the value for summation word SUM[N+M−1:0] generated subsequent to the start of the given convert-multiply cycle. Alternatively, if the logical value for the comparison result VLD generated during any given convert-multiply cycle indicates the sampled and held analog quantity $V_A$ was not overvalued, then the multiplexer module 308 is logically configured to select the speculative summation SS[N+M−1:0] thereby generating prior to the end of the given convert-multiply cycle the value for the second digital word P[N+M−1:0] equal to the value for speculative summation SS[N+M−1:0] generated during the given convert-multiply cycle. Consequently, the second digital word P[N+M−1:0] whose value is generated prior to the end of any given convert-multiply cycle is equal to the proper value for the summation of partial products corresponding to the digital operand A[M−1:0] and each bit belonging to the subset of resolved logical bit values of the first digital word D[N−1:0] whose value is generated prior to the end of the same given convert-multiply cycle.

In accordance with the processing performed by the SSM module 112 shown in FIG. 3, the value of the second digital word P[N+M−1:0] is adjusted throughout a particular sequence of N consecutive convert-multiply cycles such that the N-th value for the second digital word P[N+M−1:0] generated prior to the end of any N-th convert-multiply cycle is equal to the value for the summation of partial products corresponding to the digital operand A[M−1:0] and all N bits belonging to the subset of resolved logic bit values of the first digital word D[N−1:0] whose value is generated prior to the end of the same N-th convert-multiply cycle. Therefore, the N-th value for the second digital word P[N+M−1:0] generated prior to the end of the N-th convert-multiply cycle is equal to the digital product whose value is equivalent to the value formed by multiplying the digital operand A[M−1:0] with the N-th value of the first digital word D[N−1:0] indicative of the sampled and held analog quantity $V_A$.

Although the logic configuration of the SSM module 112 shown in FIG. 3 assumes the first digital word D[N−1:0], the digital operand A[M−1:0], and the second digital word P[N+M−1:0] each have an unsigned binary encoding, it would be apparent to those knowledgeable in the art how to adapt the logic configuration to support alternative number encoding schemes, which include, but may not be limited to, two's complement, one's complement, signed digit, and Booth encoding(s). Furthermore, although the logic configuration of the SSM module 112 shown in FIG. 3 assumes the logical value of a single bit of the first digital word D[N−1:0] is resolved during each convert-multiply cycle, it would also be apparent to those knowledgeable in the art how to adapt the logic configuration to support cases when the logical value of more than one bit of the first digital word D[N−1:0] is resolved during each convert-multiply cycle.

Figure 4:
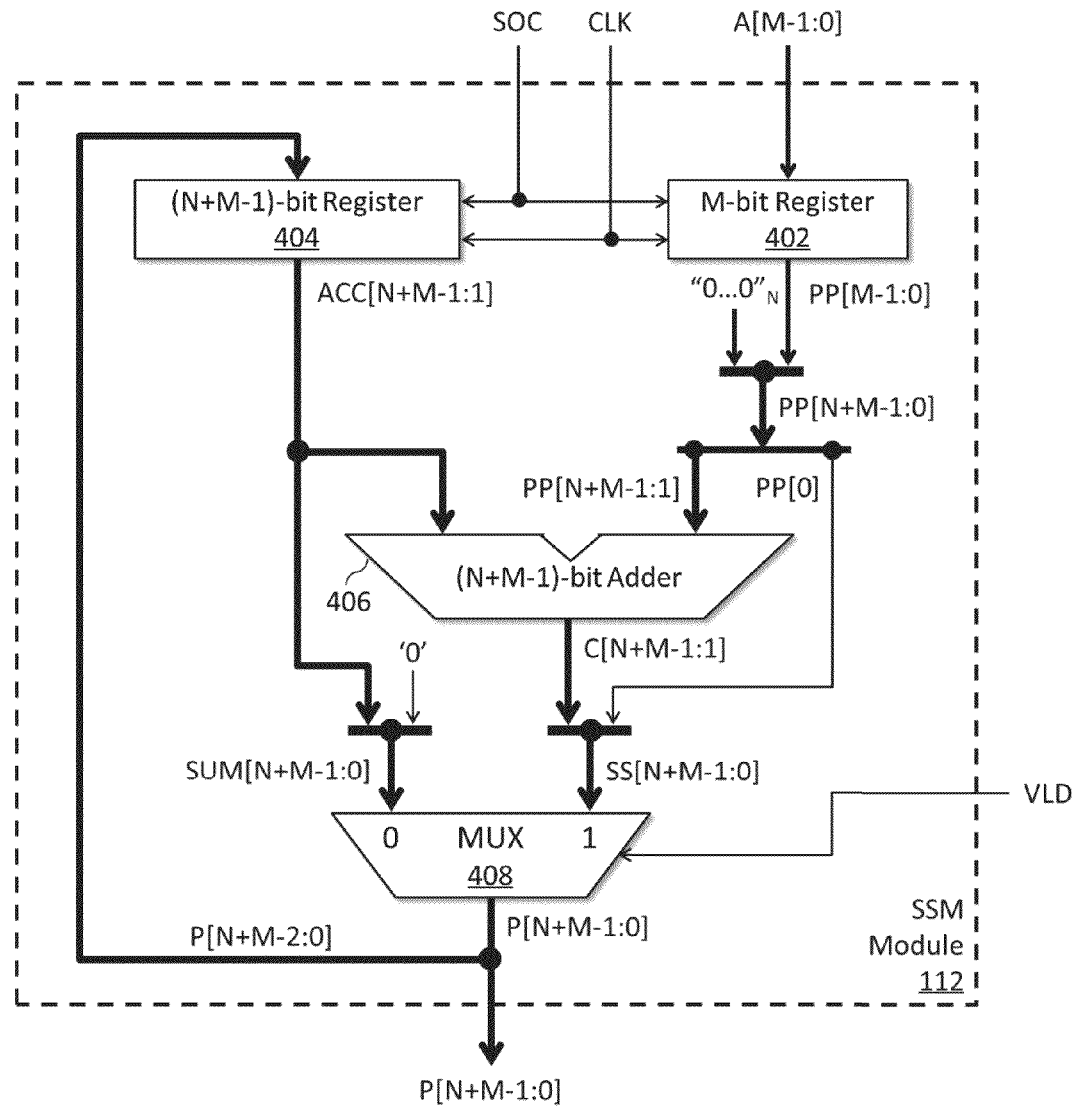
FIG. 4 shows in detail another logic configuration for a speculative sequential multiplier module in accordance with an embodiment.

FIG. 4: Another Logic Configuration of the SSM Module

FIG. 4 shows in detail another logic configuration of the SSM module 112 shown in FIG. 1 in accordance with an embodiment. The logic configuration comprises an M-bit holding register module 402, an (N+M−1)-bit accumulation register module 404, an (N+M−1)-bit addition module 406, and an (N+M)-bit multiplexer module 408. The SSM module 112 shown in FIG. 4 is also configured in a manner which assumes the first digital word D[N−1:0], the digital operand A[M−1:0], and the second digital word P[N+M−1:0] are each encoded using the unsigned binary encoding scheme well known by those knowledgeable in the art. Furthermore, the SSM module 112 shown in FIG. 4 is also configured in a manner which assumes the value of the first digital word D[N−1:0] is refined by resolving during each convert-multiply cycle a single bit thereof starting from the most significant bit D[N−1].

The holding register module 402 receives the CLK signal, the SOC command signal, and the M-bit digital operand A[M−1:0]. The holding register module 402 is logically configured to generate a value for an M-bit speculative partial product PP[M−1:0] subsequent to the start of each convert-multiply cycle. The most significant bit and least significant bit of the M-bit speculative partial product PP[M−1:0] is PP[M−1] and PP[0], respectively. When transitioning from a particular sample-hold cycle to a corresponding first convert-multiply cycle, the holding register module 402 is logically configured to latch or store synchronously with the CLK signal the value of the digital operand A[M−1:0] in response to the change in the logical value of the SOC command signal thereby generating subsequent to the start of the first convert-multiply cycle the first value for the M-bit speculative partial product PP[M−1:0] equal to the latched or stored value of the digital operand A[M−1:0]. The holding register module 402 is logically configured to hold or maintain the first value of the M-bit speculative partial product PP[M−1:0] during the succeeding N−1 convert-multiply cycles following the first convert-multiply cycle thereby generating in succession the remaining N−1 values for the M-bit speculative partial product PP[M−1:0] each equal to the first value of the M-bit speculative partial product PP[M−1:0].

Different values of the digital operand A[M−1:0] may be latched or stored synchronously with the CLK signal by the holding register module 402 each time the SOC command signal changes from the first to the second logical value as part of the apparatus 100 transitioning from a particular sample-hold cycle to a corresponding first convert-multiply cycle. Those knowledgeable in the art will appreciate that although the holding register module 402 is included as part of the logic configuration of the SMM module 112 shown in FIG. 4, the holding register module 402 may be superfluous and may not necessitate implementation if there is an alternative means provided for holding or maintaining a value of the digital operand A[M−1:0] as the value for the M-bit speculative partial product PP[M−1:0] during sequences of N consecutive convert-multiply cycles.

The SSM module 112 shown in FIG. 4 is logically configured to generate a value for an (N+M)-bit speculative partial product PP[N+M−1:0] subsequent to the start of each convert-multiply cycle. The most significant bit and least significant bit of the (N+M)-bit speculative partial product PP[N+M−1:0] is PP[N+M−1] and PP[0], respectively. The SSM module 112 shown in FIG. 4 forms the (N+M)-bit speculative partial product PP[N+M−1:0] by concatenating an N-bit word, designated as "0 . . . 0"$_N$ and having a constant value of zero, adjacent to the most significant bit PP[M−1] of the M-bit speculative partial product PP[M−1:0] whose value is generated by the holding register module 402 subsequent to the start of each convert-multiply cycle. Furthermore, the SSM module 112 shown in FIG. 4 is logically configured to generate a value for an (N+M−1)-bit portion of the (N+M)-bit speculative partial product PP[N+M−1:0] subsequent to the start of each convert-multiply cycle. The (N+M−1)-bit portion of the (N+M)-bit speculative partial product PP[N+M−1:0] will be referred to hereinafter as "the most significant portion of the speculative partial product" and designated hereinafter as PP[N+M−1:1]. The most significant portion of the speculative partial product PP[N+M−1:1] comprises bits from the (N+M)-bit speculative partial product PP[N+M−1:0] ranging from the most significant bit PP[N+M−1] down to the bit PP[1] having positional significance $2^1$.

The accumulation register module 404 receives the CLK signal, the SOC command signal, and a value for an (N+M−1)-bit portion of the (N+M)-bit second digital word P[N+M−1:0], wherein the value for the (N+M)-bit second digital word P[N+M−1:0] is generated by the multiplexer module 408 prior to the end of each convert-multiply cycle. The (N+M−1)-bit portion of the (N+M)-bit second digital word P[N+M−1:0] will be referred to hereinafter as "the least significant portion of the second digital word" and designated hereinafter as P[N+M−2:0]. The least significant portion of the second digital word P[N+M−2:0] comprises bits from the (N+M)-bit second digital word P[N+M−1:0] ranging from the bit P[N+M−2] having positional significance $2^{N+M-2}$ down to the least significant bit P[0]. The accumulation register module 404 is logically configured to generate a value for an (N+M−1)-bit accumulation word ACC[N+M−1:1] subsequent to the start of each convert multiply cycle. When transitioning from a particular sample-hold cycle to a corresponding first convert-multiply cycle, the accumulation register module 404 is logically configured to reset synchronously with the CLK signal in response to the change in the logical value of the SOC command signal thereby generating subsequent to the start of the first convert-multiply cycle the first value for the accumulation word ACC[N+M−1:1] equal to zero. Upon reset, the accumulation register module 404 is logically configured to latch or store the value for the least significant portion of the second digital word P[N+M−2:0] generated prior to the end of any given convert-multiply cycle thereby generating a value for the accumulation word ACC[N+M−1:1] subsequent to the start of the convert-multiply cycle following the given convert-multiply cycle equal to the latched or stored value of the least significant portion of the second digital word P[N+M−2:0]. Accordingly, the accumulation register module 404 generates a value for the accumulation word ACC[N+M−1:1] subsequent to the start of each convert-multiply cycle.

The addition module 406 receives the accumulation word ACC[N+M−1:1] whose value is generated by the accumulation register module 404 subsequent to the start of each convert-multiply cycle along with the most significant portion of the speculative partial product PP[N+M−1:1] whose value is generated by the SSM module 112 shown in FIG. 4 subsequent to the start of each convert-multiply cycle. The addition module 406 is logically configured to add the accumulation word ACC[N+M−1:1] to the most significant portion of the speculative partial product PP[M+N−1:1] thereby generating a value for an (N+M−1)-bit combination word C[N+M−1:1] during each convert-multiply cycle. The most significant bit of the combination word C[N+M−1:1] is C[N+M−1] and the bit of the combination word C[N+M−1:1] having positional significance $2^1$ is C[1].

The addition module 406 may be of the carry look-ahead, parallel prefix, or conditional sum architecture types, or may be constructed from a combination of architecture types thereof. However, in general, any architecture type or combination of architecture types may be utilized for realizing the addition module 406. Nevertheless, those knowledgeable in the art will appreciate that the addition module 406 may be substantially simplified as a consequence of the bits of the most significant portion of the speculative partial product PP[N+M−1:1] ranging from bit PP[N+M−1] down to bit PP[M] having constant logical values. Moreover, those knowledgeable in the art will recognize that a multi-function arithmetic logic unit capable of performing addition of at least two operands may replace the addition module 406.

The SSM module 112 shown in FIG. 4 is logically configured to generate a value for an (N+M)-bit summation word SUM[N+M−1:0] subsequent to the start of each convert-multiply cycle. The most significant bit and the least significant bit of the (N+M)-bit summation word SUM[N+M−1:0] is SUM[N+M−1] and SUM[0], respectively. The SSM module 112 shown in FIG. 4 forms the summation word SUM[N+M−1:0] by concatenating a constant logical '0' value adjacent to the bit ACC[ ] of the accumulation word ACC[N+M−1:1] whose value is generated by the accumulation register module 404 subsequent to the start of each convert-multiply cycle. During any given convert-multiply cycle, the value for the summation word SUM[N+M−1:0] generated subsequent to the start of the given convert-multiply cycle is equal to the value of the second digital word P[N+M−1:0] generated by the multiplexer module 408 and weighted by two raised to an integer power equal to one by the SSM module 112 shown in FIG. 4 by means of a logical shift to the left by one bit position prior to the end of the convert-multiply cycle preceding the given convert-multiply cycle. Accordingly, the value for the summation word SUM[N+M−1:0] generated by the SSM module 112 shown in FIG. 4 subsequent to the start of any given convert-multiply cycle is the value formed by weighting by two the summation of partial products corresponding to the digital operand A[M−1:0] and each bit belonging to the subset of resolved logical bit values of the first digital word D[N−1:0] whose value was generated by the SAR-ADC module 102 (shown in FIG. 1) prior to the end of the convert-multiply cycle preceding the given convert-multiply cycle. Provided the bit of the first digital word D[N−1:0] whose logical value is being resolved during any given cycle were to be resolved to a logical '0' value prior to the end of the given convert-multiply cycle, the value for the summation word SUM[N+M−1:0] generated subsequent to the start of the given convert-multiply cycle would be equal to the proper value for the summation of partial products corresponding to the digital operand A[M−1:0] and each bit belonging to the subset of resolved logical bit values of the first digital word D[N−1:0] whose value would be generated by the SAR-ADC module 102 (shown in FIG. 1) prior to the end of the given convert-multiply cycle.

Since the bit SUM[0] of the summation word SUM[N+M−1:0] has a constant logical '0' value during each convert-multiply cycle due to the weighting performed by the SSM module 112 shown in FIG. 4, what would be a single-bit storage location of the accumulation register module 404 for latching or storing the constant logical '0' value of the bit SUM[0] is superfluous and may not necessitate implementation. Accordingly, the accumulation register module 404 along with the addition module each have the bit-width of N+M−1 rather than a bit-width of N+M.

The SSM module 112 shown in FIG. 4 is additionally logically configured to generate a value for an (N+M)-bit speculative summation SS[N+M−1:0] during each convert-multiply cycle. The most significant bit and the least significant bit of the speculative summation SS[N+M−1:0] is SS[N+M−1] and SS[0], respectively. The SSM module 112 shown in FIG. 4 forms the speculative summation SS[N+M−1:0] by concatenating the logical value of the least significant bit PP[0] of the speculative partial product adjacent to the bit C[1] of the combination word C[N+M−1:1] whose value is generated by the addition module 406 during each convert-multiply cycle. Provided the bit of the first digital word D[N−1:0] whose logical value is being resolved during any given cycle were to be resolved to a logical '1' value prior to the end of the given convert-multiply cycle, the value for the speculative summation SS[N+M−1:0] generated during the given convert-multiply cycle would be equal to the proper value for the summation of partial products corresponding to the digital operand A[M−1:0] and each bit belonging to the subset of resolved logical bit values of the first digital word D[N−1:0] whose value would be generated by the SAR-ADC module 102 (shown in FIG. 1) prior to the end of the given convert-multiply cycle.

Predicting the value of the partial product during any given convert-multiply cycle by assuming that the bit of the first digital word D[N−1:0] whose logical value is being resolved during the given convert-multiply cycle will be resolved to a logical '1' value rather than waiting to receive the resolved logical value for the bit in order to generate the proper value for the partial product for the given convert-multiply cycle allows for an elimination of a AND module typically utilized for generating partial products. The elimination of the AND logic module provides additional processing time for generating the value for the speculative summation SS[N+M−1:0] during any given convert-multiply cycle prior to receiving during the same given convert-multiply cycle the logical value for the comparison result VLD generated by the CMP module 110 (shown in FIG. 1).

The multiplexer module 408 receives the comparison result VLD whose value is generated by the CMP module 110 (shown in FIG. 1) during each convert-multiply cycle, the summation word SUM[N+M−1:0] whose value is generated by the SSM module 112 shown in FIG. 4 subsequent to the start of each convert-multiply cycle, and the speculative summation SS[N+M−1:0] whose value is generated by the SSM module 112 shown in FIG. 4 during each convert-multiply cycle. The multiplexer module 408 is logically configured to generate the value for the (N+M)-bit second digital word P[N+M−1:0] prior to the end of each convert-multiply cycle in response to, and upon the arrival of, the logical value for the comparison result VLD generated during each convert multiply cycle indicating whether or not the sampled and held analog quantity $V_A$ was overvalued.

If the logical value for the comparison result VLD generated during any given convert-multiply cycle indicates the sampled and held analog quantity $V_A$ was overvalued, then the multiplexer module 408 is logically configured to select the summation word SUM[N+M−1:0] thereby generating prior to the end of the given convert-multiply cycle the value for the second digital word P[N+M−1:0] equal to the value for the summation word SUM[N+M−1:0] generated subsequent to the start of the given convert-multiply cycle. Alternatively, if the logical value for the comparison result VLD generated during any given convert-multiply cycle indicates the sampled and held analog quantity $V_A$ was not overvalued, then the multiplexer module 408 is logically configured to select the speculative summation SS[N+M−1:0] thereby generating prior to the end of the given convert-multiply cycle the value for the second digital word P[N+M−1:0] equal to the value for the speculative summation SS[N+M−1:0] generated during the given convert-multiply cycle. Consequently, the second digital word P[N+M−1:0] whose value is generated prior to the end of any given convert-multiply cycle is equal to the proper value for the summation of partial products corresponding to the digital operand A[M−1:0] and each bit belonging to the subset of resolved logical bit values of the first digital word D[N−1:0] whose value is generated prior to the end of the same given convert-multiply cycle.

Those knowledgeable in the art will recognize that the least significant bit-slice of the multiplexer module 408 may be replaced by a single-bit, two-input AND logic module (not shown) as a consequence of the least significant bit SUM[0] of the summation word SUM[N+M−1:0] having a constant logical '0' value during each convert-multiply cycle. Therefore, the bit-width of the multiplexer module 408 may be reduced from the bit-width of N+M down to a bit-width of N+M−1, wherein the least significant bit-slice of the multiplexer module 408 would be replaced by the single-bit, two-input AND logic module (not shown).

In accordance with the processing performed by the SSM module 112 shown in FIG. 4, the value for the second digital word P[N+M−1:0] is adjusted throughout a particular sequence of N consecutive convert-multiply cycles such that the N-th value for the second digital word P[N+M−1:0] generated prior to the end of any N-th convert-multiply cycle is equal to the value for the summation of partial products corresponding to the digital operand A[M−1:0] and all N bits belonging to the subset of resolved logic bit values of the first digital word D[N−1:0] whose value is generated prior to the end of the same N-th convert-multiply cycle. Therefore, the N-th value for the second digital word P[N+M−1:0] generated prior to the end of the N-th convert-multiply cycle is equal to the digital product whose value is equivalent to the value formed by multiplying the digital operand A[M−1:0] with the N-th value of the first digital word D[N−1:0] indicative of the sampled and held analog quantity $V_A$.

Similar to the logic configuration of the SSM module 112 shown in FIG. 3, not only would it be apparent to those knowledgeable in the art how to adapt the logic configuration of the SSM module 112 shown in FIG. 4 to support alternative number encoding schemes, but it would also be apparent to those knowledgeable in the art how to adapt the logic configuration to support cases when the logical value of more than one bit of the first digital word D[N−1:0] is resolved during each convert-multiply cycle.

Figure 5:
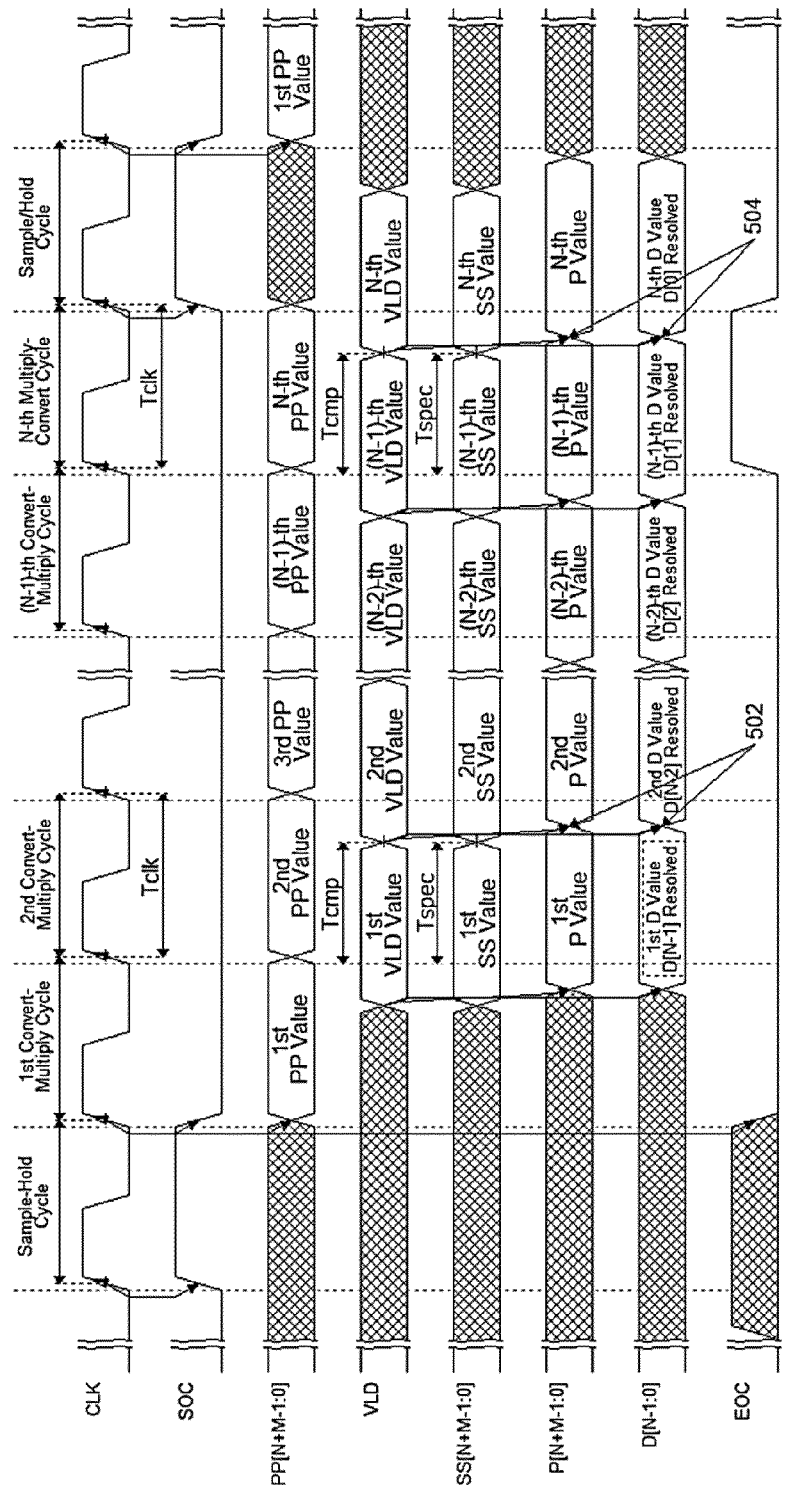
FIG. 5 shows a timing diagram illustrating certain aspects regarding the operation of an apparatus for sequential analog/digital conversion and multiplication in accordance with an embodiment.

FIG. 5: Timing Diagram

FIG. 5 shows a timing diagram illustrating the operation of an embodiment of the apparatus 100 shown in FIG. 1. The timing diagram as shown in FIG. 5 illustrates the apparatus 100 progressing through an exemplary sample-hold cycle followed by an exemplary sequence of N consecutive convert-multiply cycles, wherein the apparatus 100 is configured to refine the value of the first digital word D[N−1:0] by resolving a single bit thereof during each convert-multiply cycle starting from the most significant bit D[N−1]. The N-th convert-multiply cycle is annotated to specifically underscore certain aspects with regard to the mode of operation of the apparatus 100, although those knowledgeable in the art will appreciate that any of the N consecutive convert-multiply cycles, such as the $2^{nd}$ convert-multiply cycle, may have been chosen to illustratively accentuate the certain aspects. The period of the CLK signal during at least the N consecutive convert-multiply cycles is annotated on the timing diagram shown in FIG. 5 and is denoted by a temporal quantity $T_{clk}$. The quantity $T_{clk}$ is defined to be the approximate time associated with an embodiment of the SAR-ADC module 102 (shown in FIG. 1) for resolving the logical value of a single bit of the first digital word D[N−1:0].

The timing diagram shown in FIG. 5 is additionally annotated with temporal quantities $T_{cmp}$ and $T_{spec}$ during the N-th convert-multiply cycle. The quantity $T_{cmp}$ is indicative of the aggregate delay and/or settling time attributed to the apparatus 100 for generating in sequence the N-th values for the estimated digital word E[N−1:0], the estimated analog quantity $V_E$, and the comparison result VLD. The quantity $T_{spec}$ is indicative of the aggregate delay and/or settling time attributed to the apparatus 100 for generating in sequence the N-th values for the speculative partial product PP[N+M−1:0] (essentially zero delay due to the elimination of an AND logic module) and the speculative summation SS[N+M−1:0]. As demonstrated by the timing diagram shown in FIG. 5, the apparatus 100 via the SSM module 112 exploits coarse-grained and fine-grained parallelism associated with performing sequential analog/digital conversion and multiplication across the N consecutive convert-multiply cycles and within each convert-multiply cycle, respectively. Particularly, the apparatus 100 is configured in a manner which overlaps a substantial portion of the processing associated with performing a single iteration of sequential multiplication with a substantial portion of the processing associated with performing a single iteration of sequential analog/digital conversion. Consequently, the processing time associated with the substantial portion of the sequential multiplication processing performed during each convert-multiply cycle, as indicated by quantity $T_{spec}$, overlaps the processing time associated with the substantial portion of the sequential analog/digital conversion processing performed during each convert-multiply cycle, as indicated by quantity $T_{cmp}$.

Moreover, the timing diagram shown in FIG. 5 shows a reference numeral 504 for the N-th convert-multiply cycle. As indicated by the reference numeral 504 in conjunction with the quantity $T_{cmp}$, the apparatus 100 generates the N-th value for the comparison result VLD after a time $T_{cmp}$ and subsequently generates in response to the N-th value for the comparison result VLD the N-th values for the first digital word D[N−1:0] and the second digital word P[N+M−1:0] prior to the end of the N-th convert-multiply cycle. As a consequence of the speculative processing performed by the SSM module 112, the apparatus 100 may generate the N-th value for the second digital word P[N+M−1:0] within the time duration $T_{clk}$ established by the SAR-ADC module 102 (shown in FIG. 1) since the apparatus 100 was able to generate, with sufficient time remaining prior to the end of the N-th convert-multiply cycle, the N-th value of the speculative summation SS[N+M−1:0] independent of both the N-th logical value of the comparison result VLD and the resolved logical value for the least significant bit D[0] of the first digital word D[N−1:0].

ADVANTAGES AND CONCLUSION

In accordance with the forgoing description of certain embodiments of an apparatus configured to perform sequential analog/digital conversion and multiplication, certain advantages may include, but may not be limited to, those described by the following discussion.

The digital output indicative of the analog input and the digital product whose value is equivalent to the product formed by multiplying the digital operand with the digital output indicative of the analog input are both generated during the final conversion cycle of the sequential analog/digital converter and/or prior to completing the conversion.

Speculative processing substantially increases the computation parallelism associated with performing sequential analog/digital conversion and multiplication by exploiting coarse-grained and fine-grained parallelism across consecutive conversion cycles and within each conversion cycle, respectively.

Speculative processing may enable generating the value for the summation of partial products prior to the end of each conversion cycle while substantially maintaining the operative clock period and/or the operative frequency at which the digital output is refined and without necessarily having to temporarily latch or store intermediate multiplication results such as partial products.

Speculative processing may allow for the operative frequency for performing sequential analog/digital conversion and multiplication to be substantially determined by the operative frequency at which the digital output is refined and may not necessarily be substantially impeded by the speculative sequential multiplication processing performed per conversion cycle.

An AND logic module typically utilized for generating partial products is eliminated thereby allowing additional processing time per conversion cycle for generating the value of the speculative summation of partial products. The additional time contributes to substantially maintaining the operative clock period and/or the operative frequency at which the digital output is refined.

Several modules, including the approximation register module 204, the first OR logic module 206, the multiplexer module 208, the AND-OR module 209, the addition module 306, the accumulation register module 404, the addition module 406, and the multiplexer module 408 may be implemented with a reduced bit-width.

Various signal processing applications having to manipulate the digital product together with digital output indicative of analog input may do so pending the end of analog/digital conversion.

Although specifics of certain embodiments pertaining to an apparatus for performing sequential analog/digital conversion and multiplication are described, the embodiments are to be regarded in an illustrative rather than a restrictive sense. As such, the embodiments are not intended to represent the only embodiments which may be practiced. Those knowledgeable in the art will recognize and/or envision various modifications and/or alterations which can be made to one or more aspects of the embodiments. For example, the apparatus may comprise alternative configuration(s) of a sequential analog/digital converter of the successive approximation type and/or a sequential analog/digital converter which employs an alternative search strategy. Accordingly, it would be apparent those knowledgeable in the art how to adapt the logic configuration of the speculative sequential multiplier. Therefore, the inventive spirit and scope of the embodiments should be defined by the appended claims and their legal equivalents rather than by the embodiments shown and described herein.

I claim:

1. An apparatus for analog/digital conversion and multiplication, said apparatus comprising:
   conversion circuitry for converting an analog input to a digital output, said conversion circuitry configured to refine in succession said digital output by processing said analog input, said conversion circuitry completing conversion when said digital output becomes indicative of said analog input; and
   multiplication circuitry configured to generate a digital product equivalent to the product formed by multiplying a digital operand with said digital output indicative of said analog input, wherein said digital product is determined prior to said digital output becoming indicative of said analog input.

2. The apparatus of claim 1, wherein said multiplication circuitry further comprises:
   first speculation circuitry configured, for each refinement of said digital output, to process said digital operand thereby generating at least one current speculative partial product;
   second speculation circuitry configured, for each refinement of said digital output, to combine a previous partial result with each current speculative partial product thereby generating a previous partial result weighted by two raised to an integer power and at least one current speculative partial result; and
   selection circuitry configured, for each refinement of said digital output, to generate a current partial result by choosing either said weighted previous partial result or one current speculative partial result.

3. The apparatus of claim 2, wherein said conversion circuitry comprises determining circuitry configured, for and during each refinement of said digital output, to process said analog input to determine the manner in which said digital output is refined.

4. The apparatus of claim 3, wherein said selection circuitry chooses a current partial result in response to a corresponding determination of said determining circuitry.

5. The apparatus of claim 3, wherein said conversion circuitry is of the successive approximation type.

6. An apparatus for analog/digital conversion and multiplication, said apparatus comprising:
   conversion circuitry for converting an analog input to a digital output, said conversion circuitry configured to process in succession said analog input to determine the manner in which to refine said digital output such that the digital output is refined in succession in response to a corresponding determination, said conversion circuitry completing conversion when said digital output becomes indicative of said analog input; and
   multiplication circuitry configured to generate a digital product equivalent to the product formed by multiplying a digital operand with said digital output indicative of said analog input, wherein said digital product is determined prior to said digital output becoming indicative of said analog input.

7. The apparatus of claim 6, wherein said multiplication circuitry further comprises:
   first speculation circuitry configured, for each refinement of said digital output, to process said digital operand thereby generating at least one current speculative partial product;
   second speculation circuitry configured, for each refinement of said digital output, to combine a previous partial result with each current speculative partial product thereby generating a previous partial result weighted by two raised to an integer power and at least one current speculative partial result; and
   selection circuitry configured, for each refinement of said digital output, to generate a current partial result by choosing either said weighted previous partial result or one current speculative partial result in response to a corresponding determination by said conversion circuitry.

8. The apparatus of claim 7, wherein said second speculation circuitry weights said weighted previous partial result during a previous refinement of said conversion circuitry.

9. The apparatus of claim 8, wherein said conversion circuitry is of the successive approximation type.

10. An apparatus for sequential analog/digital conversion and multiplication, said apparatus comprising:
    conversion circuitry for converting an analog input to a digital output, said digital output comprising a plurality of bits, said conversion circuitry configured to resolve one or more bits in succession starting from a first bit by processing said analog input to determine the manner in which to resolve each said one or more bits, said converter circuitry completing the conversion subsequent to resolving a last bit resulting in said digital output becoming indicative of said analog input;
    first speculation circuitry configured, for each resolution, to process a digital operand thereby generating at least one current speculative partial product;
    second speculation circuitry configured, for each resolution, to combine a previous partial result with each current speculative partial product thereby generating at least one current speculative partial result and a previous partial result weighted by two raised to an integer power; and
    selection circuitry configured, for each resolution, to generate a current partial result by choosing either said weighted previous partial result or one current speculative partial result in response to a corresponding determination by said conversion circuitry;
    whereby the current partial result is determined to be a digital product equal to the product formed by multiplying said digital operand with said digital output indicative of said analog input prior to the resolution of said last bit of said digital output.

11. The apparatus of claim 10, wherein said first speculation circuitry includes holding circuitry configured to hold said digital operand.

12. The apparatus of claim 11, wherein said holding circuitry includes a register.

13. The apparatus of claim 10, wherein said first speculation circuitry includes a first weighting circuitry configured to weight said digital operand by two raised to an integer power.

14. The apparatus of claim 13, wherein said first weighting circuitry includes registering circuitry configured to capture said digital operand and weight said captured operand by two raised to incrementally adjusted powers.

15. The apparatus of claim 10, wherein said second speculation circuitry includes a second weighting circuitry configured to weight said previous partial result by two raised to an integer power; said second speculation circuitry further including summing circuitry configured to sum said weighted previous partial result with said at least one current speculative partial product.

16. The apparatus in claim 15, wherein said second weighting circuitry weights said weighted previous partial result during a previous resolution of said conversion circuitry.

17. The apparatus of claim 15, wherein said second weighting circuitry is a shifter circuit configured to shift said previous partial result in a direction by a fixed amount.

18. The apparatus of claim 15, wherein said summing circuitry includes at least one adder.

19. The apparatus of claim 10, wherein said selection circuitry is a multiplexer circuit.

* * * * *